United States Patent
Kim (10) Patent No.: US 7,333,782 B2
(45) Date of Patent: Feb. 19, 2008

(54) AUTOMATIC GAIN CONTROLLER FOR ACHIEVING HIGH SIGNAL-TO-NOISE RATIO AND LOW POWER LOSS, AND A TRANSMITTING APPARATUS AND METHOD FOR USE WITH A MOBILE COMMUNICATION TERMINAL HAVING THE AUTOMATIC GAIN CONTROLLER

(75) Inventor: Hyun-seok Kim, Gwacheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 400 days.

(21) Appl. No.: 10/841,096

(22) Filed: May 7, 2004

(65) Prior Publication Data

US 2004/0224653 A1 Nov. 11, 2004

(30) Foreign Application Priority Data

May 9, 2003 (KR) .................. 10-2003-0029367

(51) Int. Cl.
*H04B 1/04* (2006.01)
(52) U.S. Cl. .............................. 455/127.1; 455/127.2; 455/126; 455/91
(58) Field of Classification Search .. 455/127.1–127.5, 455/136, 138, 232.1, 234.1, 118, 126, 91; 330/278–279; 370/296, 285, 335
See application file for complete search history.

(56) References Cited

U.S. PATENT DOCUMENTS

| | | | | |
|---|---|---|---|---|
| 4,502,021 A * | 2/1985 | Hill et al. | .................... | 330/285 |
| 5,307,512 A * | 4/1994 | Mitzlaff | ...................... | 455/126 |
| 5,862,460 A * | 1/1999 | Rich | .......................... | 455/116 |
| 5,926,749 A * | 7/1999 | Igarashi et al. | .......... | 455/127.2 |
| 6,341,219 B1 * | 1/2002 | Poirier et al. | ............... | 455/116 |
| 6,498,927 B2 * | 12/2002 | Kang et al. | .............. | 455/245.2 |
| 6,735,422 B1 * | 5/2004 | Baldwin et al. | ......... | 455/232.1 |
| 6,748,200 B1 * | 6/2004 | Webster et al. | .......... | 455/234.1 |
| 6,763,228 B2 * | 7/2004 | Prentice et al. | .......... | 455/127.2 |
| 6,853,256 B2 * | 2/2005 | Takenaka et al. | ........ | 455/127.1 |
| 6,977,976 B1 * | 12/2005 | Birkett et al. | ............... | 375/345 |
| 7,184,729 B2 * | 2/2007 | Kluge et al. | ............. | 455/234.1 |

(Continued)

*Primary Examiner*—Lana Le
(74) *Attorney, Agent, or Firm*—F. Chau & Assoc., LLC (57) ABSTRACT

Provided is an automatic gain controller for obtaining a high a signal-to-noise ratio (SNR), and for reducing power loss by controlling a gain until the gain reaches a maximum value, and a transmitting apparatus and method for use with a mobile communication terminal having the automatic gain controller. The automatic gain controller causes a variation of a gain at a radio frequency (RF) amplifier with respect to the variation of a control voltage to have a larger gradient than a variation of gain at an intermediate frequency (IF) amplifier with respect to the variation of the control voltage, and causes a total gain to have a decreasing gradient in accordance with the control voltage until the total gain reaches its maximum. Therefore, a high SNR can be obtained by adjusting the gain at the IF amplifier to be larger than the gain at the RF amplifier at a power of, for example, −13 dBm, to obtain improved adjacent channel power rejection (ACPR) characteristics at a high power, and to reduce power loss by controlling gain so that the total gain has a decreasing gradient in accordance with the control voltage until the total gain reaches its maximum.

22 Claims, 6 Drawing Sheets

U.S. PATENT DOCUMENTS

2003/0203726 A1* 10/2003 Kluge et al. ............. 455/234.1
2004/0214537 A1* 10/2004 Bargroff et al. ............. 455/136
2005/0233714 A1* 10/2005 Kajiwara et al. ......... 455/127.3

* cited by examiner

AUTOMATIC GAIN CONTROLLER FOR ACHIEVING HIGH SIGNAL-TO-NOISE RATIO AND LOW POWER LOSS, AND A TRANSMITTING APPARATUS AND METHOD FOR USE WITH A MOBILE COMMUNICATION TERMINAL HAVING THE AUTOMATIC GAIN CONTROLLER

CROSS-REFERENCE TO RELATED APPLICATION

This application claims priority to Korean Patent Application No. 2003-29367, filed on May 9, 2003, in the Korean Intellectual Property Office, the disclosure of which is incorporated herein by reference.

BACKGROUND OF THE INVENTION

1. Technical Field

The present invention relates to an automatic gain controller, and more particularly, to a transmitting apparatus for use with a mobile communication terminal having the automatic gain controller.

2. Discussion of the Related Art

A transmitting apparatus, for example, a transmitter, of a mobile communication terminal, such as a cellular phone, consumes the majority of its battery power when transmitting data input by a user or searching for a base station. For example, when the user hits a calling key of the mobile communication terminal or sends a text message, in other words, when the user desires to transmit data, the transmitting apparatus receives a data stream or symbols related to phone number information or text message information. The transmitting apparatus then converts the received data stream or the received symbols into a packet according to a code division multiple access (CDMA) standard, modulates the packet, and transmits the modulated packet to a base station as a radio frequency (RF) signal over a carrier wave channel.

The mobile communication terminal also consumes a considerable amount of power when searching for a base station in a roaming state. This occurs when the mobile communication terminal is in the process of determining if it is within a communication range of the base station by transmitting/receiving a channel check signal to/from the base station to determine if it can connect to an allotted communication channel. Thereafter, the mobile communication terminal displays a result of the determination in a manner that can be easily recognized by a user possessing the mobile communication terminal by using, for example, a liquid crystal display (LCD) or a light emitted diode (LED).

Because the mobile communication terminal transmits predetermined data input by the user or the channel check signal to the base station wirelessly after amplifying the predetermined data or the channel check signal using an intermediate frequency (IF) amplifier and an RF amplifier, the power consumption of the mobile communication terminal is dependent on the gain control processes carried out by the RF amplifier and the IF amplifier. A method of reducing power consumption by controlling gain using an automatic gain controller has been disclosed in International Patent Application No. PCT/US2000/16269, entitled "Adjusting Maximum Transmit Power to Maintain Constant Margin for Adjacent Channel Power Rejection."

Figure 1A:
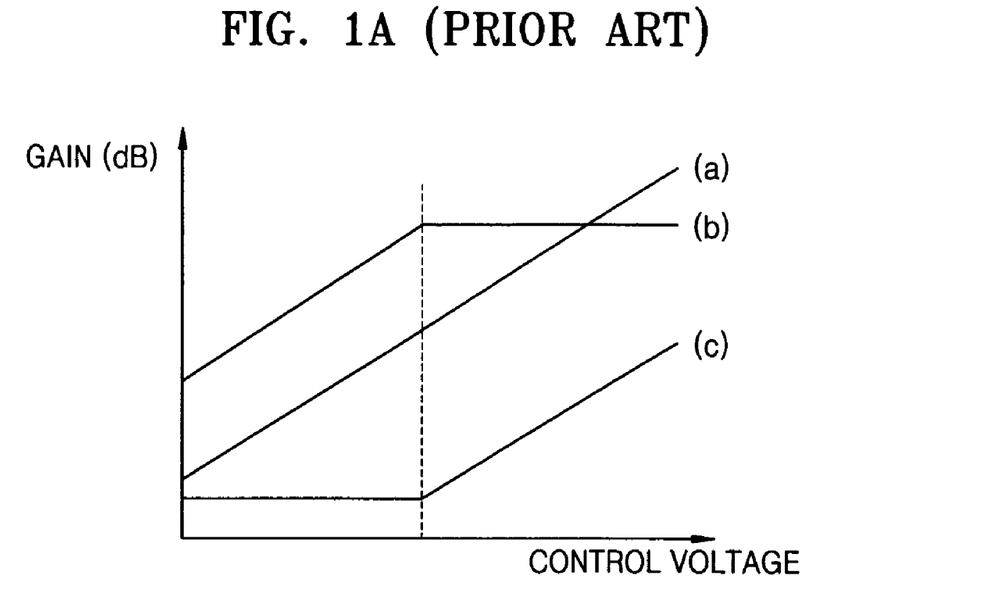
FIGS. 1A and 1B are graphs illustrating the characteristics of amplifiers of a conventional transmitting apparatus of a mobile communication terminal.
Figure 1B:
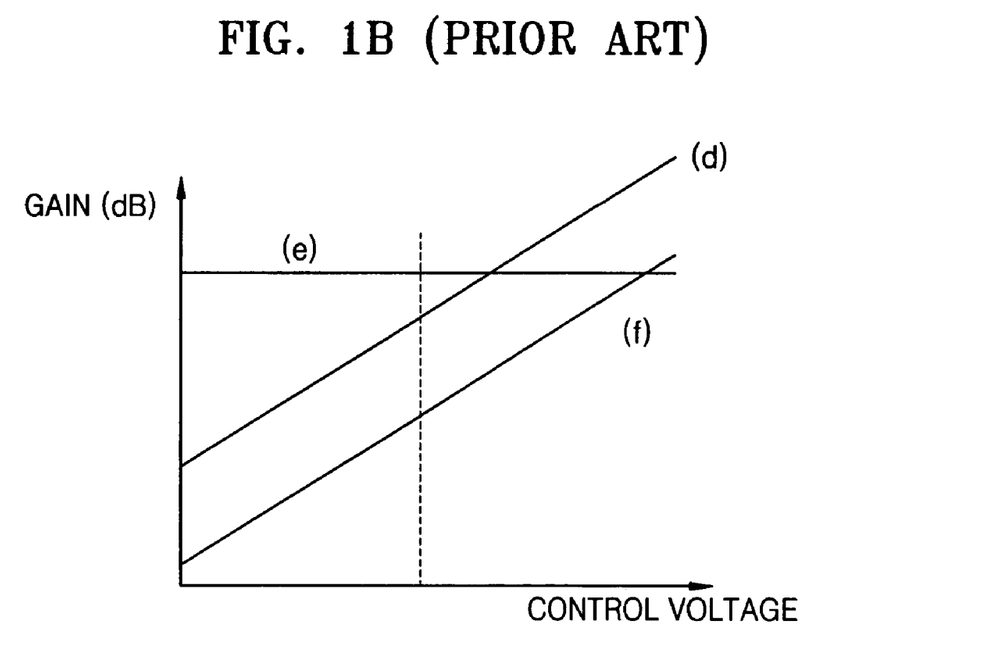

FIGS. 1A and 1B are graphs illustrating the characteristics of amplifiers of a conventional transmitting apparatus of a mobile communication terminal. More specifically, FIG. 1A illustrates the gain characteristics of an IF terminal, and FIG. 1B illustrates gain the characteristics of an RF terminal. In FIG. 1A, (a), (b), and (c) represent variations of power, signal-to-noise ratio (SNR), and spurious noise, respectively at the IF terminal with respect to the variation of a control voltage. Likewise, in FIG. 1B, (d), (e), and (f) represent variations of power, SNR, and spurious noise, respectively at the RF terminal with respect to the variation of the control voltage. As shown in FIGS. 1A and 1B, specific gain measurements are not illustrated. Instead, FIGS. 1A and 1B illustrate gain variation tendencies of power, SNR, and spurious noise, at the IF terminal and the RF terminal, respectively with respect to the control voltage.

According to the CDMA standards, the power of a mobile communication terminal is controlled such that a transmitting apparatus has a gain of +70 dB or higher. In most conventional transmitting apparatuses, such gain characteristics can be obtained by using an automatic gain controller disposed at an IF terminal. In addition, some conventional transmitting apparatuses include a variable gain amplifier, which is disposed at a driver terminal. As shown to the left of the vertical dashed line of FIG. 1A, the spurious noise (c) is maintained at a constant level without regard to the decrease of gain controlled by a predetermined control voltage level, because of a heat noise of approximately −174 dBm/Hz. Accordingly, the SNR (b) gradually decreases in accordance with the decrease of the control voltage as long as the spurious noise (c) is maintained at the constant level.

In FIG. 1B, unlike in FIG. 1A, the spurious noise (f) gradually decreases in accordance with the decrease of the control voltage, and the SNR (e) is maintained at a constant level without regard to the variation of the control voltage. Therefore, the total gain characteristics of the transmitting apparatus are characterized by the SNR being varied when performing a gain control process using the IF terminal, and the SNR is maintained at a constant level when performing a gain control process using the RF terminal.

Figure 2A:
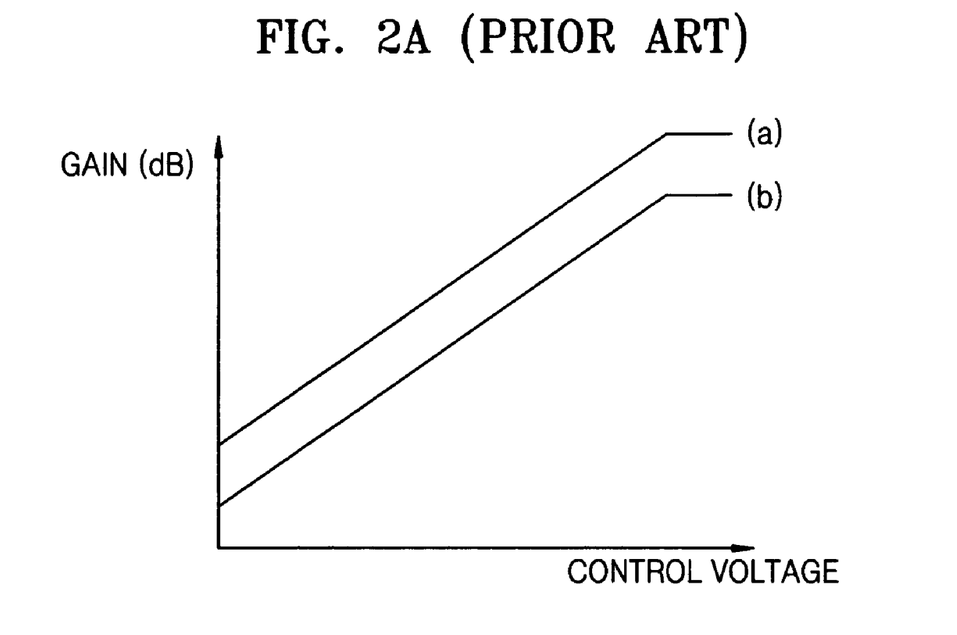
FIGS. 2A and 2B are graphs illustrating the gain characteristics of a conventional transmitting apparatus depending on how much gain an automatic gain controller distributes to an RF terminal and an IF terminal.
Figure 2B:
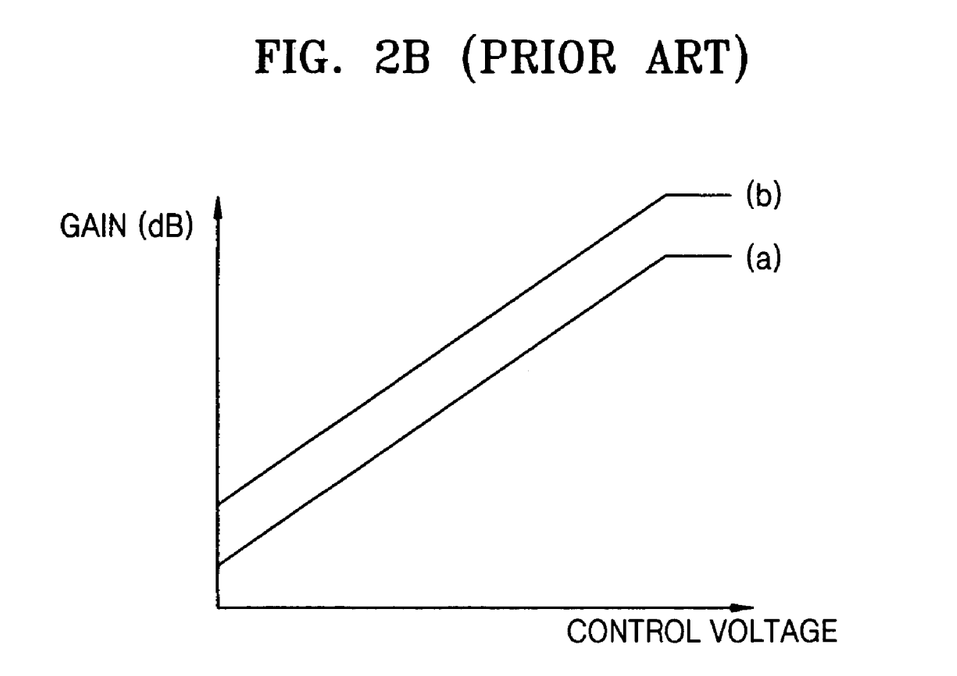

FIGS. 2A and 2B are graphs illustrating the gain characteristics of a conventional transmitting apparatus depending on how much gain an automatic gain controller distributes to an RF terminal and an IF terminal. In FIGS. 2A and 2B, (a) and (b) represent gain at the RF terminal and gain at the IF terminal, respectively.

In FIG. 2A, a signal that is output from the conventional transmitting apparatus has the same variable gain characteristics as shown in FIG. 2B. In the conventional transmitting apparatus, a desired variable gain range and a desired output power level can be obtained by adjusting the gain (a) at the RF terminal and the gain (b) at the IF terminal. According to the CDMA standards, adjacent channel power rejection (ACPR) characteristics, which are defined therein, are measured at a maximum output power of +23 dBm or higher, and when the gain at the RF terminal of the conventional transmitting apparatus is higher, its ACPR characteristics are enhanced. On the other hand, the spurious emission characteristics, which are defined in the CDMA standards, are measured at a maximum output power of −13 dBm, and when the gain at the IF terminal increases, it is more likely to obtain a higher SNR having a spurious tone and a noise floor.

When the gain (a) at the RF terminal is larger than the gain (b) at the IF terminal, as shown in FIG. 2A, noise may be considerably amplified. Thus, it may be difficult to obtain enhanced spurious emission characteristics. On the other hand, when the gain (b) at the IF terminal is larger than the gain (a) at the RF terminal, as shown in FIG. 2B, a high SNR can be obtained from the IF terminal. Thus, it is not difficult to obtain desired spurious emission characteristics. However, because a signal with a high magnitude is typically applied to the RF terminal, it is relatively difficult to obtain linearity and enhanced ACPR characteristics.

The maximum power of a typical transmitting apparatus of a mobile communication terminal generally ranges from +23 dBm to +25 dBm, and the typical transmitting apparatus consumes a current of about 600-700 mA when gain at each amplifier approximately reaches its maximum. The current consumption of the typical transmitting apparatus is considerably affected by a slight variation of ±1 dB in the power of the typical transmitting apparatus. Therefore, unless a maximum gain at each amplifier is precisely controlled in a mobile communication terminal using a battery as a power source, the mobile communication terminal inefficiently uses or dissipates current and the battery's life is shortened.

Accordingly, there is a need to control the gain of an RF amplifier and an IF amplifier in a mobile communication device in order for the device to transmit, for example, a CDMA signal without consuming a considerable amount of power

SUMMARY OF THE INVENTION

According to an aspect of the present invention, there is provided an automatic gain controller. The automatic gain controller comprises a voltage-to-current converter, which generates and outputs a first current that increases proportionally to a control voltage in response to the control voltage, a current generator, which converts the first current into a second current that increases exponentially with respect to the control voltage, outputs the second current, and outputs a third current that is obtained by subtracting the second current from a total current, a first linear gain controller, which generates and outputs an IF gain control signal for controlling an IF amplifier, and a second linear gain controller, which generates and outputs an RF gain control signal for controlling an RF amplifier.

According to another aspect of the present invention, there is provided a transmitting apparatus for use with a mobile communication terminal. The transmitting apparatus comprises a modulator, which receives a data stream packetized according to a code division multiple access (CDMA) standard, outputs a CDMA analog signal after modulating the data stream, and outputs a control voltage to control an output power of an RF signal corresponding to packet data of the data stream, an automatic gain controller, which generates a first current that increases exponentially in accordance with the control voltage in response to the control voltage, generates and outputs an IF gain control signal for controlling an IF amplifier, generates and outputs an RF gain control signal for controlling an RF amplifier, and an RF module, which receives the CDMA analog signal, amplifies an IF signal and an RF signal corresponding to the IF gain control signal and the RF gain control signal, respectively, and wirelessly transmits one of the amplified IF and RF signals.

The automatic gain controller further comprises a voltage-to-current converter, which generates and outputs the first current, a current generator, which converts the first current into a second current that increases exponentially in accordance with the control voltage, outputs the second current, and outputs a third current obtained by subtracting the second current from a total current, a first linear gain controller, which generates and outputs an IF gain control signal for controlling the IF amplifier, and a second linear gain controller, which outputs an RF gain control signal for controlling the RF amplifier.

First linear gain characteristics, which are obtained by the first linear gain controller with respect to a variation of the control voltage comprise a first gradient in a linear section, and the second linear gain characteristics, which are obtained by the second linear gain controller with respect to a variation of the control voltage, comprise a second gradient. The second gradient is larger than the first gradient. A total gain obtained by the IF amplifier and the RF amplifier is characterized by third linear gain characteristics, which are the sum of the first and second linear gain characteristics. The third linear gain characteristics comprise a third gradient, which is larger than the first gradient and smaller than the second gradient.

In a transitional area between the linear section and a saturated section, the third linear gain characteristics comprise a gradient that decreases from the third gradient to zero in accordance with the control voltage to control the total gain until the total gain reaches a maximum. In the first linear gain controller, one of a diode and a bipolar junction transistor comprises a first area, and one of the diode and the bipolar junction transistor comprises a second area, and in the second linear gain controller, one of a diode and a bipolar junction transistor comprises a third area, and one of the diode and the bipolar junction transistor comprises a fourth area. The first area is the same as the fourth area, and the second area is the same as the third area.

According to yet another aspect of the present invention, there is provided an automatic gain controlling method. The automatic gain controlling method comprises (a) generating and outputting a first current that increases proportionally to a control voltage in response to the control voltage, (b) converting the first current into a second current that increases exponentially with respect to the control voltage, outputting the second current, and a third current that is obtained by subtracting the second current from a total current, (c) generating and outputting an IF gain control signal for controlling an IF amplifier, and (d) generating and outputting an RF gain control signal for controlling an RF amplifier.

According to another aspect of the present invention, there is provided a method for transmitting a communication from a mobile communication terminal. The transmitting method comprises (a) receiving a data stream packetized according to a CDMA standard, outputting a CDMA analog signal after modulating the data stream, and outputting a control voltage to control an output power of an RF signal corresponding to packet data of the data stream, (b) generating a first current that increases exponentially in accordance with the control voltage in response to the control voltage, generating and outputting an IF gain control signal for controlling an IF amplifier, and generating and outputting an RF gain control signal for controlling an RF amplifier, and (c) receiving the CDMA analog signal, amplifying an IF signal and an RF signal corresponding to the IF gain control signal and the RF gain control signal, respectively, and wirelessly transmitting one of the amplified IF and RF signals.

Step (b) comprises (d) generating and outputting the first current, (e) converting the first current into a second current that increases exponentially in accordance with the control voltage, outputting the second current, and a third current obtained by subtracting the second current from a total current, (f) generating and outputting an IF gain control signal for controlling the IF amplifier, and (g) generating and outputting an RF gain control signal for controlling the RF amplifier.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

Figure 3:
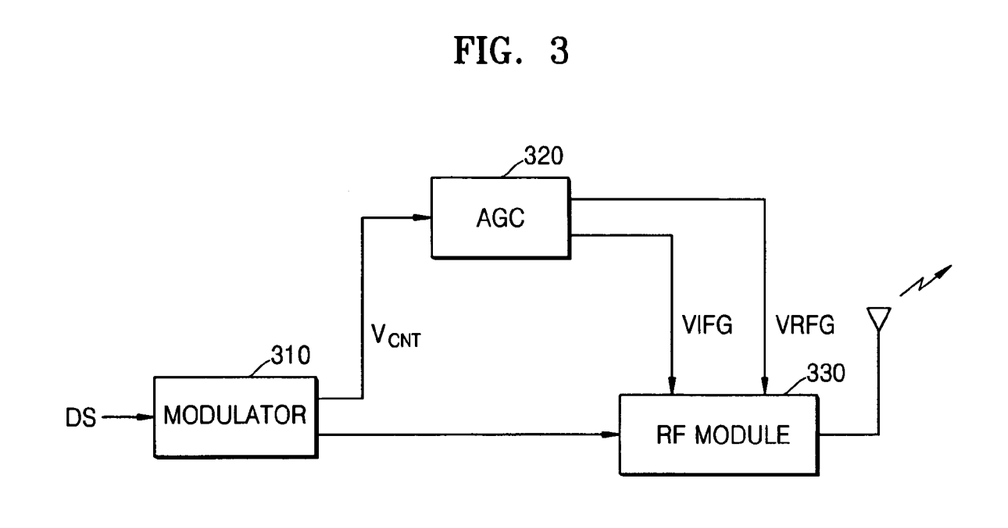
FIG. 3 illustrates a transmitting apparatus of a mobile communication terminal, according to an exemplary embodiment of the present invention.

FIG. 3 illustrates a transmitting apparatus of a mobile communication terminal, according to an exemplary embodiment of the present invention. Referring to FIG. 3, the transmitting apparatus includes a modulator 310, an automatic gain controller 320, and a radio frequency (RF) module 330.

The modulator 310 modulates a data stream DS, which is packetized according to, for example, one of the code division multiple access (CDMA) standards, outputs a CDMA analog signal as a result of the modulation, and outputs a control voltage $V_{cnt}$, which is used to control the output power of an RF signal.

The output power of the RF signal depends on the type of data stream DS input to the modulator 310 and the distance between a base station and a mobile communication terminal. The transmitting apparatus consumes a considerable amount of power when, for example, it receives data to be transmitted, such as a data stream including phone number information or text message information or symbols, packetizes the data stream or the symbols in according to CDMA, modulates the packetized data stream or the packetized symbols, and transmits the modulated data stream to the base station as wireless frequency signals over an allotted carrier wave channel. In addition, the mobile communication terminal consumes excess power when searching for a base station over its allotted carrier wave channel when in a roaming state while transmitting a search signal. Further, the mobile communication terminal consumes additional power and generates excess heat when the distance between the mobile communication terminal and the base station increases.

The automatic gain controller 320 generates a current that increases exponentially in accordance with the control voltage $V_{cnt}$. In addition, by using the current, the automatic gain controller 320 generates and outputs an intermediate frequency (IF) gain control signal VIFG for controlling an IF amplifier so that first linear gain characteristics can be obtained for the variation of the control voltage $V_{cnt}$, and generates and outputs an RF gain control signal VRFG for controlling an RF amplifier so that second linear gain characteristics can be obtained for the variation of the control voltage $V_{cnt}$.

Figure 7:
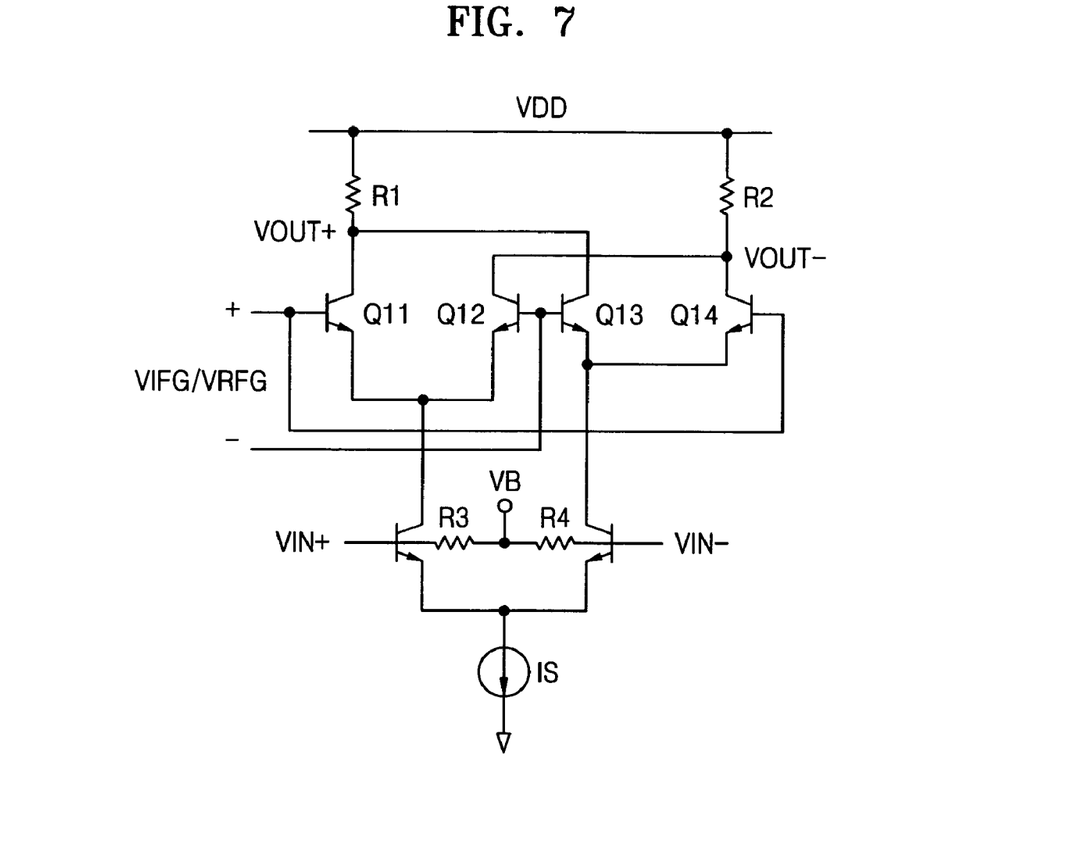
FIG. 7 illustrates an IF amplifier and/or an RF amplifier according to an exemplary embodiment of the present invention.

The RF module 330 receives the CDMA analog signal, amplifies an IF signal corresponding to the IF gain control signal VIFG and an RF signal corresponding to the RF gain control signal VRFG, and transmits the amplified IF signal and the amplified RF signal over a carrier wave in a wireless manner. The amplification of the IF signal and/or the RF signal is performed by an amplifier shown in FIG. 7. Referring to FIG. 7, an IF and/or RF amplifier amplifies an IF signal input thereto in response to the IF gain control signal VIFG or an RF signal input thereto in response to the RF gain control signal VRFG and outputs an amplified IF signal or an amplified RF signal, respectively. The IF signal or the RF signal is input to VIN+ or VIN−, and the amplified IF signal or the amplified RF signal is output to Vout+ and Vout−. In FIG. 7, IS represents a current source, R1-R4 represent resistors, Q11-Q14 represent bipolar junction transistors, VB represents a predetermined bias voltage, and VDD represents a power supply voltage.

Figure 4:
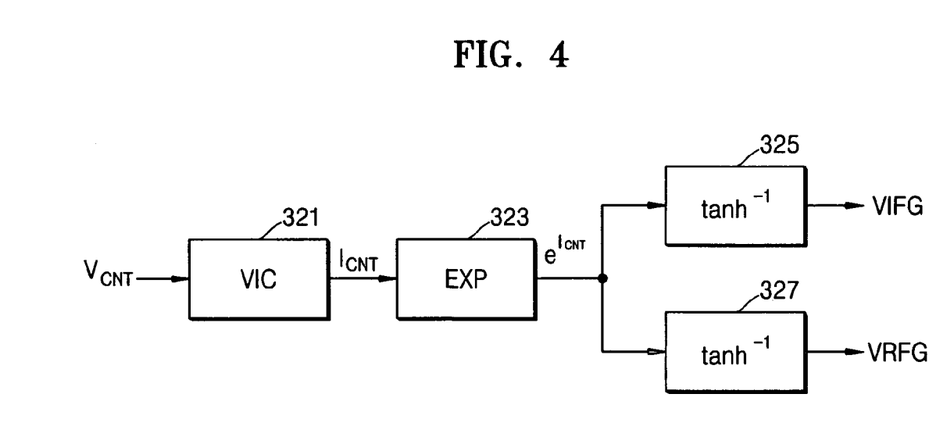
FIG. 4 illustrates an automatic gain controller of FIG. 3.

FIG. 4 illustrates the automatic gain controller 320 of FIG. 3. Referring to FIG. 4, the automatic gain controller 320 includes a voltage-to-current converter 321, an exponential function current generator 323, a first linear gain controller 325, and a second linear gain controller 327.

The voltage-to-current converter 321 outputs a current $I_{cnt}$, which varies in proportion to the control voltage $V_{cnt}$, in response to the control voltage $V_{cnt}$. The exponential function current generator 323 converts the current $I_{cnt}$ into a current $I_{bias2}$, which increases exponentially in accordance with the control voltage $V_{cnt}$, and outputs the current $I_{bias2}$ and a current $I_{bias3}$, which is obtained by subtracting $I_{bias2}$ from a total output current $I_{total}$.

Figure 5:
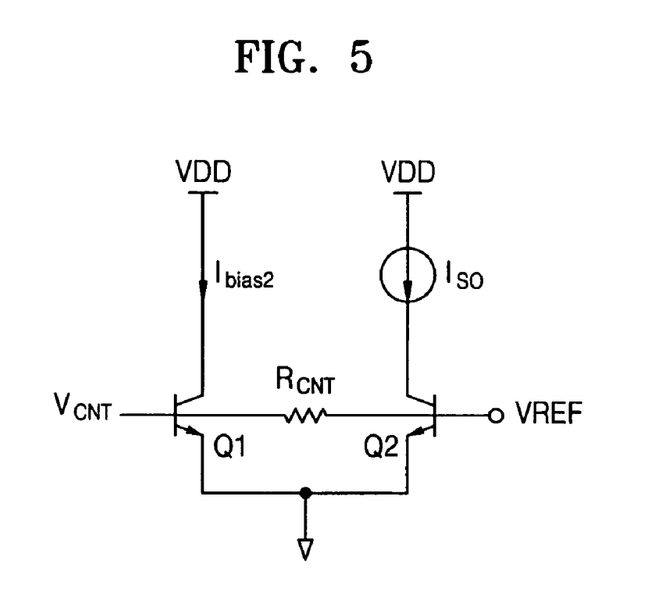
FIG. 5 illustrates a voltage-to-current converter and an exponential function current generator of FIG. 4.

The voltage-to-current converter 321 and the exponential function current generator 323 are illustrated in FIG. 5. Referring to FIG. 5, a resistor $R_{cnt}$ generates the current $I_{cnt}$, which increases proportionally to the control voltage $V_{cnt}$, between the control voltage $V_{cnt}$ and the reference voltage VREF, and the current $I_{bias2}$, which satisfies Equation (1) below, is generated by bipolar junction transistors Q1 and Q2 and a current source $I_{so}$. The total output current $I_{total}$ is a total amount of current consumed by an IF amplifier and an RF amplifier (for example, the IF and/or RF amplifiers shown in FIG. 7), which amplify an IF signal and an RF signal, respectively, for transmitting the RF signal over a carrier wave in a wireless manner, when gains at the IF amplifier and the RF amplifier reach their respective maximums. As shown in Equation (1), the current $I_{bias3}$, which is obtained by subtracting $I_{bias2}$ from $I_{total}$, may also be attained using circuit structures other than the one shown in FIG. 5. In Equation (1), $V_T$ amounts to 67 mV at a temperature of 25° C., and $V_{cnt,max}$ represents a level of the control voltage $V_{cnt}$ measured when the gains at the IF amplifier and the RF amplifier reach their respective maximums. The reference voltage VREF may be set to different levels depending on the requirements of a system.

$$I_{cnt} = \frac{V_{cnt}}{R_{cnt}} \quad (1)$$

$$I_{bias2} = I_{so} \exp\left(\frac{I_{cnt}R_{cnt}}{V_T}\right)$$

$$I_{bias3} = I_{total} - I_{bias2}$$

$$I_{total} = I_{so} \exp\frac{V_{cnt,max}}{V_T}$$

The first linear gain controller 325 (of FIG. 4) connects current sources, from which $I_{bias2}$ and $I_{bias3}$ are output, to diodes and/or bipolar junction transistors each having a collector and a base connected to each other, in series. The first linear gain controller 325 generates and outputs the IF gain control signal VIFG for controlling the IF amplifier so that the first linear gain characteristics can be obtained for the variation of the control voltage $V_{cnt}$.

The second linear gain controller 327 (of FIG. 4) connects the current sources, from which $I_{bias2}$ and $I_{bias3}$ are output, to diodes and/or bipolar junction transistors each having a collector and a base connected to each other, in series. The second linear gain controller 327 generates and outputs the RF gain control signal VRFG for controlling the RF amplifier so that the second linear gain characteristics can be obtained for the variation of the control voltage $V_{cnt}$.

Figure 6:
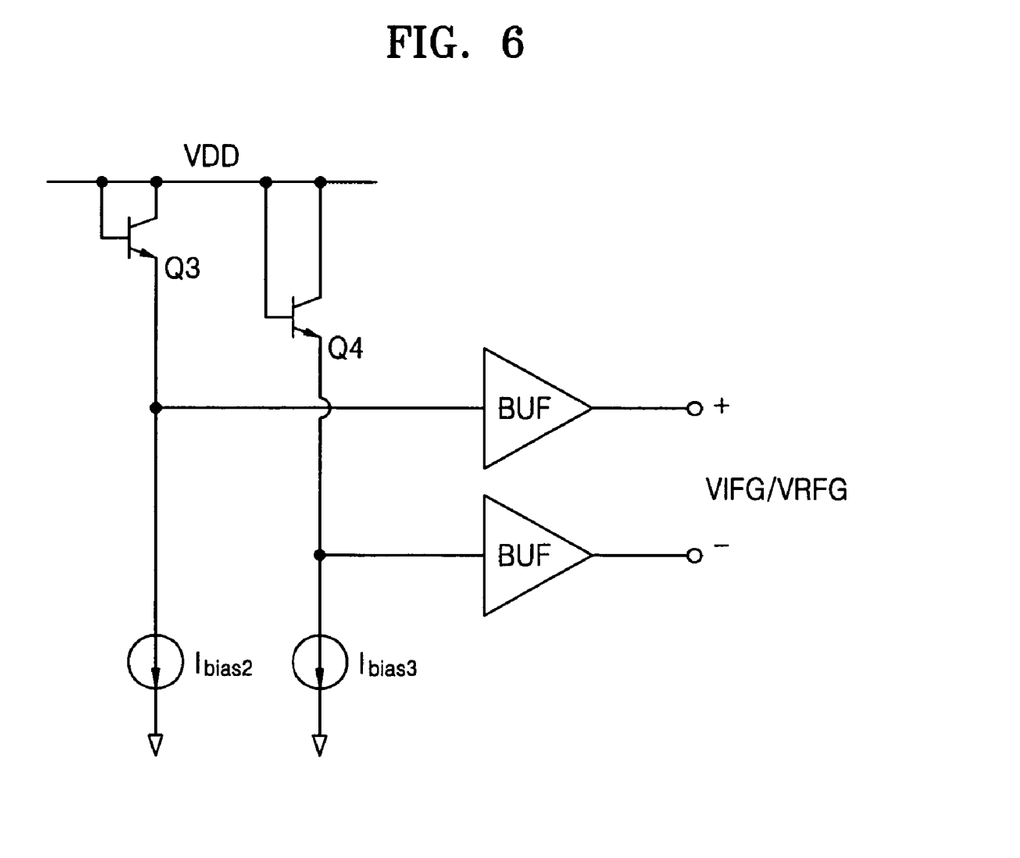
FIG. 6 illustrates a circuit that outputs an intermediate frequency (IF) gain control signal VIFG and/or a radio frequency (RF) gain control signal VRFG according to an exemplary embodiment of the present invention.

The structure the first and second linear gain controllers 325 and 327, which carry out a linear gain function $\tan h^{-1}$, is illustrated in FIG. 6. When the first linear gain controller 325 has a structure as shown in FIG. 6, a bipolar junction transistor Q3 (or a diode) is connected to the current source, from which $I_{bias2}$ is output, in cascade and has a first area A1, and a bipolar junction transistor Q4 (or a diode) is connected to the source current, from which $I_{bias3}$ is output, in cascade and has a second area A2. Power of an emitter of the bipolar junction transistors Q3 and Q4 (or power of a cathode of the bipolar junction transistors (or diodes) Q3 and Q4) is output via predetermined buffers BUF in order to stabilize the power of the emitters of the bipolar junction transistors Q3 and Q4.

Likewise, when the second linear gain controller 327 has a structure as shown in FIG. 6, a bipolar junction transistor Q3 (or a diode) is connected to the source current, from which $I_{bias2}$ is output, in cascade and has a third area A3, and a bipolar junction transistor Q4 (or a diode) is connected to the source current, from which $I_{bias3}$ is output, and has a fourth area A2. Power of an emitter of the bipolar junction transistors Q3 and Q4 (or power of a cathode of the bipolar junction transistors (or diodes) Q3 and Q4) is output via a predetermined buffer BUF.

If the first area A1 is equal to the fourth area A4, the second area A2 is equal to the third area A3, and the first area A1 is larger than the second area A2, as shown in Equation (2), the gain at the IF amplifier and the gain at the RF amplifier can be expressed by Equations (3) and (4), respectively. In Equations (3) and (4), $G_{IFO}$ represents a gain value that is determined based on the characteristics of the IF amplifier, and $G_{RFO}$ represents a gain value that is determined based on the characteristics of the RF amplifier.

$$A1 = A4 > A2 = A3 \quad (2)$$

$$\text{Gain} = G_{IFO}\frac{A1I_{so}\exp(I_{cnt}R_{cnt}/V_T)}{A2I_{total} + (A1-A2)I_{so}\exp(I_{cnt}R_{cnt}/V_T)} \quad (3)$$

$$\text{Gain} = G_{RFO}\frac{A2I_{so}\exp(I_{cnt}R_{cnt}/V_T)}{A1I_{total} + (A2-A1)I_{so}\exp(I_{cnt}R_{cnt}/V_T)} \quad (4)$$

Figure 8:
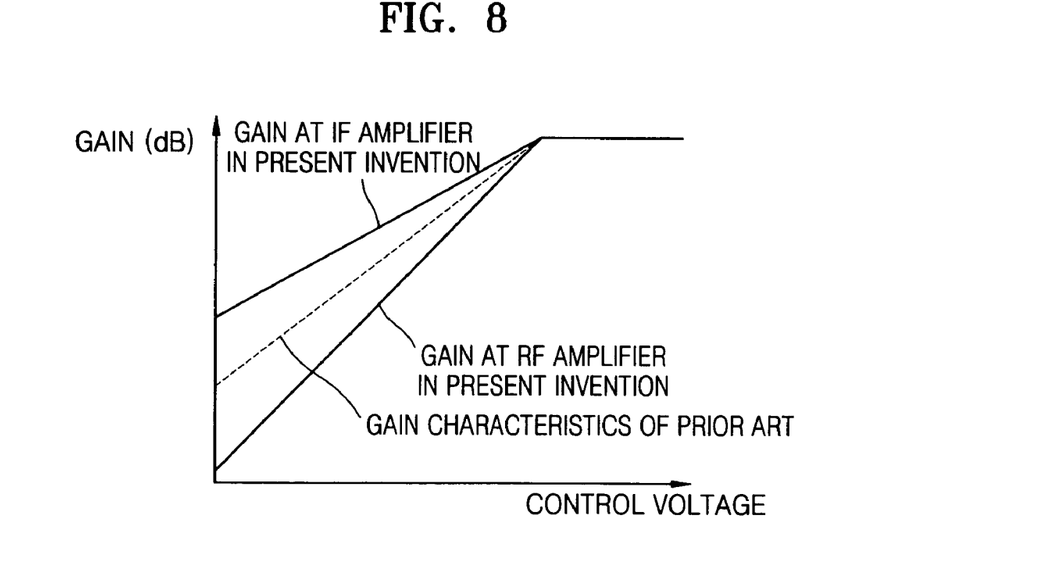
FIG. 8 is a graph illustrating a comparison of the gain characteristics of the transmitting apparatus of FIG. 3 with the gain characteristics of a conventional transmitting apparatus.

FIG. 8 is a graph illustrating gain variations at the IF amplifier and the RF amplifier of, for example, FIG. 7, with respect to the variation of the control voltage $V_{cnt}$. Referring to FIG. 8, the first linear gain characteristics, e.g., improved characteristics of the IF amplifier, have a first gradient in a linear section, and the second linear gain characteristics, e.g., improved characteristics of the RF amplifier, have a second gradient in the linear section. Here, the second gradient is larger than the first gradient. More specifically, Equation (3), which expresses the gain at the IF amplifier, can be rearranged into Equation (5) below by replacing the entire denominator of Equation (3) with $A2I_{total}$ because $A2I_{total}$ has a larger value than the rest of the denominator of Equation (3). In addition, Equation (3) can be rearranged into Equation (6) below by replacing $IS_0 \exp(I_{cnt}R_{cnt}/V_T)$ with $I_{total}$.

$$\text{Gain} = G_{IFO}\frac{A1I_{so}\exp(I_{cnt}R_{cnt}/V_T)}{A2I_{total}} \quad (5)$$

$$\text{Gain} = G_{IFO}\frac{A1I_{total}}{A2I_{total} + (A1-A2)I_{total}} = G_{IFO} \quad (6)$$

Likewise, Equation (4), which expresses the gain at the RF amplifier, can be rearranged into Equation (7) by replacing the entire denominator of Equation (4) with $A1I_{total}$ because $A1I_{total}$ has a much larger value than the rest of the denominator of Equation (4). In addition, Equation (4) can be rearranged into Equation (8) by replacing $I_{so}\exp(I_{cnt}R_{cnt}/V_T)$ of the denominator in Equation (4) with $I_{total}$.

$$\text{Gain} = G_{RFO}\frac{A2I_{so}\exp(I_{cnt}R_{cnt}/V_T)}{A1I_{total}} \quad (7)$$

$$\text{Gain} = G_{RFO}\frac{A2I_{total}}{A1I_{total} + (A2-A1)I_{total}} = G_{RFO} \quad (8)$$

Because A1>A2 and A3<A4, as shown in Equation (2), the second gradient is larger than the first gradient. Therefore, in the linear section of FIG. 8, the gain of the IF amplifier is larger than the gain of the RF amplifier. In addition, improved SNR and spurious emission characteristics are achieved at, for example, an output power of −13 dBm in the linear section. Referring to FIG. 8, throughout the entire variation range of the control voltage including the linear section and a saturated section, total gain obtained by using the present invention is the same as total gain obtained by using a prior art system. Therefore, the present invention can obtain and maintain the ACPR characteristics at, for example, an output power of +23 dBm, as compared to the prior art.

As shown in FIG. 8, the total gain characteristics obtained by using both the IF amplifier and the RF amplifier are characterized by third linear gain characteristics, which are equivalent to the sum of the first linear gain characteristics obtained by solely using the IF amplifier and the second linear gain characteristics obtained by solely using the RF amplifier. In the linear section of FIG. 8, the third linear gain characteristics have a third gradient (as marked by a dashed line), which is larger than the first gradient but smaller than the second gradient.

Figure 9:
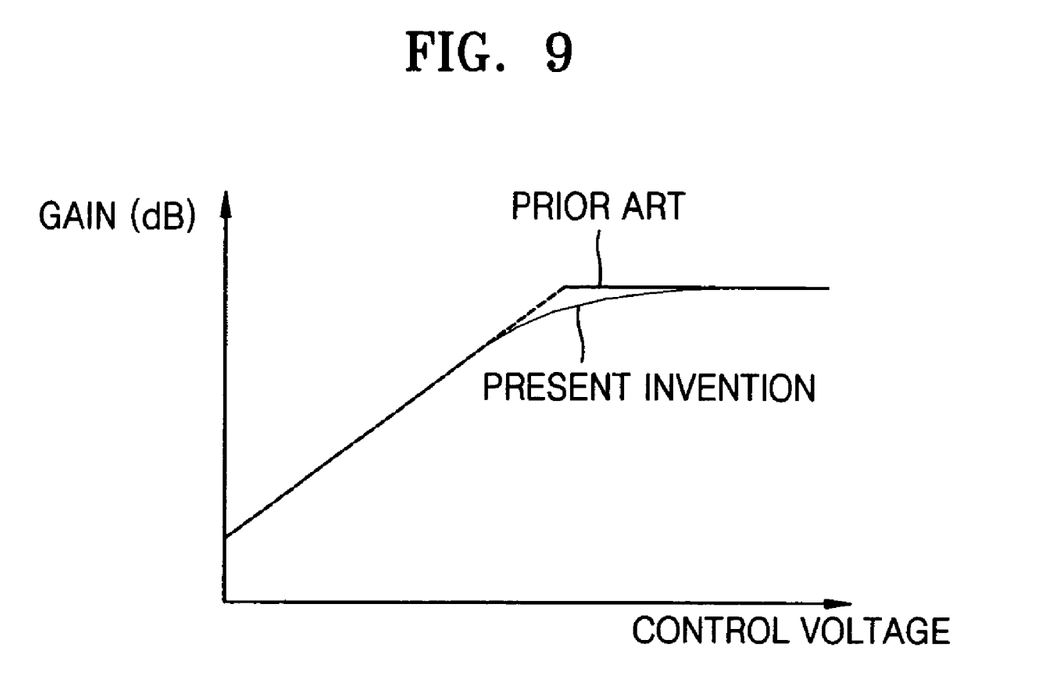
FIG. 9 is a graph illustrating a maximum gain area between a linear section and a saturated section of FIG. 8.

Referring to FIG. 9, the gradient of the third linear gain characteristics gradually varies from the third gradient to zero in a transitional area between the linear section and the saturated section. Therefore, it is possible to control the total gain in the transitional area between the linear section and the saturated section by using the control voltage $V_{cnt}$. More specifically, because the third gain characteristics have a smaller gradient in the present invention than in the prior art, in the transitional area between the linear section and the saturated section, the total gain can be precisely controlled and the variation of current consumption with respect to a slight variation of ±1 dB in the power of a transmitting apparatus can be reduced.

As described above, the automatic gain controller 320 generates a current that increases exponentially in accordance with the control voltage $V_{cnt}$ in response to the control voltage $V_{cnt}$ output from the modulator 310, generates and outputs the IF gain control signal VIFG for controlling the IF amplifier so that the first linear gain characteristics can be obtained for the variation of the control voltage $V_{cnt}$, and generates and outputs the RF gain control signal VRFG for controlling the RF amplifier so that the second linear gain characteristics can be obtained for the variation of the control voltage $V_{cnt}$. Accordingly, the RF module 330 receives the CDMA analog signal output from the modulator 310, amplifies an IF signal and an RF signal in response to the IF gain control signal VIFG and the RF gain control signal VRFG, respectively, and transmits the amplification results over a carrier wave in a wireless manner.

In short, because A1>A2 and A3<A4, as shown in Equation (2), the gain at the IF amplifier is larger than the gain at the RF amplifier in the linear section of FIG. 8, and improved SNR and spurious emission characteristics are obtained at, for example, a power of −13 dBm in the linear section of FIG. 8. In addition, because the total gain throughout the entire variation range of the control voltage $V_{cnt}$, including the linear and saturated sections of FIG. 8, has the same level in the present invention as in the prior art, variable gain characteristics of the entire transmitting apparatus are not affected by performing a gain control process using the IF and RF amplifiers, and improved ACPR characteristics are obtained at a power of, for example, +23 dBm. Moreover, the gain at the IF or RF amplifier (of FIG. 7) can be precisely controlled in the transitional area between the linear section and the saturated section as shown in FIG. 9, and a reduction in the variation of current consumption with respect to a slight variation of ±1 dB in the power of a transmitting apparatus takes place.

As described above, the automatic gain controller according to the present invention causes a variation of a gain at an RF amplifier with respect to the variation of a control voltage to have a larger gradient than the variation of a gain at an IF amplifier with respect to the variation of the control voltage and causes a total gain to have a gradually decreasing gradient in accordance with the control voltage until the total gain reaches its maximum. Therefore, a maximum SNR can be obtained by adjusting the gain at the IF amplifier to be larger than the gain at the RF amplifier at, for example, a power of −13 dBm, to obtain improved ACPR characteristics at a maximum power, and to reduce power loss by precisely controlling gain so that the total gain has a decreasing gradient in accordance with the control voltage until the total gain reaches its maximum.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An automatic gain controller, comprising;
    a voltage-to-current converter, which generates and outputs a first current that increases proportionally to a control voltage in response to the control voltage;
    a current generator, which converts the first current into a second current that increases exponentially with respect to the control voltage, outputs the second current, and outputs a third current that is obtained by subtracting the second current from a total current;
    a first linear gain controller, which generates and outputs an intermediate frequency (IF) gain control signal for controlling an IF amplifier; and
    a second linear gain controller, which generates and outputs a radio frequency (RF) gain control signal for controlling an RF amplifier.

2. The automatic gain controller of claim 1, wherein the first linear gain controller connects, in series, current sources from which the second and third currents are output to one of a diode and a bipolar junction transistor in the first linear gain controller, and then, generates and outputs the IF gain control signal for controlling the if amplifier; and
    the second linear gain controller connects, in series, the current sources from which the second and third currents are output to one of a diode and a bipolar junction transistor in the second linear gain controller, and then, generates and outputs the RF gain control signal for controlling the RF amplifier.

3. A transmitting apparatus for use with a mobile communication terminal, comprising:
    a modulator, which receives a data stream packetized according to a code division multiple access (CDMA) standard, outputs a CDMA analog signal after modulating the data stream, and outputs a control voltage to control an output power of a radio frequency (RF) signal corresponding to packetized data of the data stream;
    an automatic gain controller which generates a current that increases exponentially in accordance with the control voltage in response to the control voltage, generates and outputs a variable intermediate frequency (IF) gain control signal for controlling an IF amplifier to vary the gain thereof, and generates and outputs a variable RF gain control signal for controlling an RF amplifier to vary the gain thereof; and
    an RF module, which receives the CDMA analog signal, amplifies an IF signal and an signal corresponding to the IF gain control signal and the RF gain control signals, respectively, and wirelessly transmits one of the amplified IF and RF signals, wherein, as the IF gain varies in response to the IF gain control signal and the RF gain varies in response to the RF gain signal, the IF gain is always larger than the RF gain until a total gain obtained by the IF amplifier and the RF amplifier reaches a maximum.

4. The transmitting apparatus of claim 3, wherein the automatic gain controller comprises:
   a voltage-to-current converter, which generates and outputs a first current that increases proportionally to the control voltage in response to the control voltage;
   a current generator, which converts the first current into a second current that increases exponentially in accordance with the control voltage, outputs the second current, and outputs a third current obtained by subtracting the second current from a total current;
   a first linear gain controller, which generates and outputs the IF gain control signal for controlling he IF amplifier; and
   a second linear gain controller, which generates and outputs the RF gain control signal for controlling the RF amplifier.

5. The transmitting apparatus of claim 4, wherein first linear gain characteristics, which are obtained by the first linear gain controller with respect to a variation of the control voltage, comprise a first gradient in a linear section, and wherein second linear gain characteristics, which are obtained by the second linear gain controller with respect to the variation of the control voltage, comprise a second gradient.

6. The transmitting apparatus of claim 5, wherein the second gradient is larger than the first gradient.

7. The transmitting apparatus of claim 5, wherein the total gain obtained by the IF amplifier and the RF amplifier is characterized by third linear gain characteristics, which are the sum of the first and second linear gain characteristics.

8. The transmitting apparatus of claim 7, wherein the third linear gain characteristics comprise a third gradient, which is larger than the first gradient and smaller than the second gradient.

9. The transmitting apparatus of claim 8, wherein in a transitional area, between the linear section and a saturated section, the third linear gain characteristics comprise a gradient that decreases front the third gradient to zero in accordance with the control voltage to control the total gain until the total gain reaches its maximum.

10. The transmitting apparatus of claim 4, wherein in the first linear gain controller, one of a diode and a bipolar junction transistor comprises a first area, and one of the diode and the bipolar junction transistor comprises a second area, and in the second linear gain controller, one of a diode and a bipolar junction transistor comprises a third area and one of the diode and the bipolar junction transistor comprises a fourth area.

11. The transmitting apparatus of claim 10, wherein the first area is the same as the fourth area, and the second area is the same as the third area.

12. An automatic gain controlling method, comprising:
   (a) generating and outputting a first current that increases proportionally to a control voltage in response to the control voltage;
   (b) converting the first current into a second current that increases exponentially with respect to the control voltage, outputting the second current, and outputting a third current that is obtained by subtracting the second current from a total current;
   (c) generating and outputting an intermediate frequency (IF) gain control signal for controlling an IF amplifier; and
   (d) generating and outputting a radio frequency (RF) gain control signal for controlling an RF amplifier.

13. The transmitting method of claim 12, wherein step (c) further comprises:
   connecting, in series, current sources from which the second and third currents are output to one of a diode and a bipolar junction transistor before generating and outputting the IF gain, control signal for controlling the IF amplifier; and
   step (d) further comprises: connecting in series, the current sources from which the second and third currents are output to one of a diode and a bipolar junction transistor before generating and outputting the RF gain control signal for controlling the RF amplifier.

14. A method for transmitting a signal from a mobile communication terminal, comprising:
   (a) receiving a data stream packetized according to a code division multiple access (CDMA) standard, outputting a CDMA analog signal after modulating the data stream, and outputting a control voltage to control an output power of a radio frequency (RF) signal corresponding to packetized data of the data stream;
   (b) generating a current that increases exponentially in accordance with the control voltage in response to the control voltage, generating and outputting a variable intermediate frequency (IF) gain control signal for controlling an IF amplifier to vary the gain thereof, and generating and outputting a variable RF gain control signal for controlling an RF amplifier to vary the gain thereof; and
   (c) receiving the CDMA analog signal, amplifying an IF signal and an RF signal corresponding to the IF gain control signal and the RF gain control signal, respectively, and wirelessly transmitting one of the amplified IF and RF signals,
   wherein, as the IF gain varies in response to the IF gain control signal and the RF gain varies in response to the RF gain control signal, the IF gain is always larger than the RF gain until a total gain obtained by the IF amplifier and the RF amplifier reaches a maximum.

15. The transmitting method of claim 14, wherein step (b) comprises:
   (d) generating and outputting a first current that increases proportionally to the control voltage in response to the control voltage; and
   (e) convening the first current into a second current that increases exponentially in accordance with the control voltage and outputting the second current, and outputting a third current obtained by subtracting the second current from a total current.

16. The transmitting method of claim 15, wherein first linear gain characteristics, which are obtained after outputting the IF gain control signal, comprise a first gradient in a linear section, and the second linear gain characteristics, which are obtained after outputting the RF gain control signal, compose a second gradient.

17. The transmitting method of claim 16, wherein the second gradient is larger than the first gradient.

18. The transmitting method of claim 16, wherein the total gain obtained by the IF amplifier and the RF amplifier is characterized by third linear gain characteristics, which are the sum of the first and second linear gain characteristics.

19. The transmitting method of claim 16, wherein the third linear gain characteristics comprise a third gradient, which is larger than the first gradient and smaller than the second gradient.

20. The transmitting method of claim 19, wherein in a transitional area between the linear section and a saturated section, the third linear gain characteristics comprise a gradient that decreases from the third gradient to zero in accordance with the control voltage to control the total gain until the total gain reaches its maximum.

21. The transmitting method of claim 15, wherein when generating the IF gain control signal, one of a diode and a bipolar junction transistor comprises a first area, and one of the diode and the bipolar junction transistor comprises a second area, and when generating the RF gain control signal, one of a diode and a bipolar junction transistor comprises a third area, and one of the diode and the bipolar junction transistor comprises a fourth area.

22. The transmitting method of claim 21, wherein the first area is the same as the fourth area, and the second area is the same as the third area.

* * * * *